United States Patent
Aratani et al.

[11] Patent Number: 5,854,139
[45] Date of Patent: Dec. 29, 1998

[54] ORGANIC FIELD-EFFECT TRANSISTOR AND PRODUCTION THEREOF

[75] Inventors: Sukekazu Aratani, Hitachi; Katsumi Kondo, Hitachinaka; Shuichi Ohara, Hitachi, all of Japan

[73] Assignee: Hitachi, Ltd., Tokyo, Japan

[21] Appl. No.: 926,498

[22] Filed: Sep. 10, 1997

Related U.S. Application Data

[62] Division of Ser. No. 495,700, Jun. 27, 1995, Pat. No. 5,705,826.

[30] Foreign Application Priority Data

Jun. 28, 1994 [JP] Japan .................................. 6-146004

[51] Int. Cl.$^6$ ................................................... H01L 21/31
[52] U.S. Cl. .............................. 438/780; 438/782; 257/40
[58] Field of Search ............................... 257/40; 438/780, 438/782

[56] References Cited

U.S. PATENT DOCUMENTS 5,017,975   5/1991   Ogawa ............................................ 357/8
5,563,424  10/1996   Yang et al. ..................................... 257/40

*Primary Examiner*—Chandra Chaudhari
*Assistant Examiner*—Reneé R. Berry
*Attorney, Agent, or Firm*—Antonelli, Terry, Stout & Kraus, LLP

[57] ABSTRACT

A field-effect transistor using a conjugated oligomer having an ionization potential of 4.8 eV or above in the semiconductor layer thereof works stably and has a long life-time and can be used in a liquid crystal display device as a switching element to give excellent contrast and good performances.

8 Claims, 5 Drawing Sheets

ORGANIC FIELD-EFFECT TRANSISTOR AND PRODUCTION THEREOF

This application is a divisional application of application Ser. No. 08/495,700, filed Jun. 27, 1995, now U.S. Pat. No. 5,705,826.

BACKGROUND OF THE INVENTION

The present invention relates to a field-effect transistor (hereinafter, simply referred to as FET), and particularly to a FET using an organic compound in the semiconductor layer thereof, a method for production thereof, and a liquid crystal display using the same.

As prior FET, those using silicon or GaAs single crystal as a semiconductor layer are known and practically in use. Since they are expensive, however, a less expensive organic semiconductor, namely an organic substance exhibiting electrical characteristic properties of semiconductor and more concretely speaking a FET element using polyacetylene, has been proposed (F. Ebisawa et al.: Journal of Applied Physics, Vol. 54, No. 6, pp 3255–3269).

However, if the above-mentioned FET using polyacetylene is allowed to stand in the atmospheric air, the polyacetylene having many unsaturated bonds is readily attacked by oxygen and water and the FET is deteriorated relatively rapidly. Accordingly, FET using polyacetylene is low in stability, short in lifetime, and inferior in electrical properties. As a means for overcoming this fault, the following electrically conductive polymer has been proposed in Japanese Patent Unexamined Publication Nos. (JP-A) 62-31174 and 62-85224:

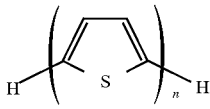

It is mentioned in these patent gazettes that an organic semiconductor constituted of the above-mentioned heterocyclic 5-membered ring polymer can be formed by an electro-chemical synthesis, and it is inexpensive and has a long lifetime.

However, this type of organic semiconductor has a fault in that the structure of electrodes and the construction of elements are much restricted because the film of organic semiconductor part is formed by an electro-chemical synthesis.

Regarding the production of FET made of an inorganic material such as Si or Ge, there has hitherto been a problem in that the size of FET is restricted by the size of wafer of such inorganic material. As for production of this type of FET, a method for producing FET on a glass substrate by using amorphous silicon film or a polysilicon film as a semiconductor is known. Amorphous silicon film is produced by the plasma chemical vapor deposition (CVD) process, and polysilicon film is usually produced by the reduced pressure CVD process.

In the plasma CVD process, it is difficult to obtain a driving element such as FET uniformly and in a large area, because of restriction by the apparatus for production and the difficulty of plasma control. Further, the system must be brought into a state of high vacuum before production of film, which is a cause for decrease in through put.

According to the reduced pressure CVD process, a film is produced by decomposing the starting gas at a high temperature of 450°–600° C. and therefore an expensive glass substrate of high heat resistance must be used, which is disadvantageous.

Since production of a large-area FET using an inorganic material as a semiconductor is accompanied by the above-mentioned difficulties, a technique of using an organic polymer as a semiconductor has been proposed (JP-A 58-114465), which is a method of coating a substrate of large area with a catalyst and introducing a starting gas onto the substrate. However, it is difficult to coat a catalyst uniformly onto a large area, and it is also difficult to introduce a starting gas uniformly onto a large area.

A FET using a metal phthalocyanine is also known [Chem. Phys. Lett., Vol. 142, p. 103 (1987)]. However, a metal phthalocyanine must be produced by a vacuum vapor deposition process, and therefore this type of FET has the same problem as in the case of using amorphous silicon as semiconductor layer when a large number of FET must be produced simultaneously and uniformly.

Recently, polythienylene derivatives obtainable through conversion from a precursor excellent in moldability and workability and soluble in solvent as a stable π-conjugated polymer are watched with interest (JP-A 4-69971).

However, this type of FET still has a problem. Thus, the process involves a condensation reaction in the presence of alkali or acid which may corrode the source and drain electrodes. For this reason, the structure of transistor is limited to some special structures such as inverse-stagger type transistor structure. Further, since the film obtained by this method is high in electric conductivity, and therefore the FET produced therefrom can carry no sufficient current between the source electrode and the drain electrode, namely no sufficient on-off ratio of the drain current.

Recently, sexithiophene derivatives which are one of conjugated oligomers are watched with interest [Advanced Materials, Vol. 2, p. 592 (1990); JP-A 4-133351]. However, this type of materials have a problem in that they are high in electric conductivity even though high in mobility, so that they are insufficient in the on-off ratio of drain current. When on-off ratio is small, and particularly when off current is high, the voltage applied to liquid crystal part is rapidly leaked when the FET is used in a liquid crystal device, which results in a decrease in the contrast of display part.

As above, when π-conjugated polymer obtained by electrochemical synthesis and an organic compound obtained by vacuum vapor deposition process are used in the semiconductor layer of FET, it is difficult to produce FET on a substrate of large area simultaneously and uniformly, which is disadvantageous from the practical point of view. Further, even when no gate voltage is applied or even when the FET is in an off state, a relatively great current flows between source electrode and drain electrode and, as its result, the on-off ratio of drain current or the switching ratio of element is so small as to make important difficulties on the utilization of the elements as a switching element.

Further, at the time of forming a semiconductor layer, the condensation reaction is made to progress in the presence of an acid or an alkali, which restricts the structure of transistor. As above, there are various unsolved problems at the present stage.

SUMMARY OF THE INVENTION

It is an object of the present invention to provide a FET which can be produced on a substrate of large area simultaneously and uniformly and can greatly modulate the drain current by changing the voltage applied to gate.

It is another object of the present invention to provide a FET which works stably with a long lifetime of elements and can be produced by a simple procedure.

It is yet another object of the present invention to provide a process for producing said FET by a simple procedure.

It is a further object of the present invention to provide a liquid crystal display using said FET, which is high in contrast ratio, inexpensive, stable, and excellent in displaying characteristics, and further to provide a large-area liquid crystal display which is inexpensive, stable and excellent in displaying characteristics.

The present invention provides a transistor comprising using a conjugated oligomer having an ionization potential of 4.8 eV or above in the semiconductor layer thereof, wherein hole mobility of said semiconductor layer is preferably 0.2 cm$^2$/Vs or above and said conjugated oligomer preferably has 6 to 12 recurring units.

The present invention further provides a field-effect transistor comprising using in the semiconductor layer thereof a compound represented by the following formula:

$$R_1 \underbrace{\left( \underset{X}{\diagup\!\!\!\diagdown} \right)_n}_{} R_2 \quad (I)$$

wherein $R_1$ and $R_2$ each independently represents a hydrogen atom or a substituent group, provided that $R_1$ and $R_2$ cannot be hydrogen atoms, or methyl groups or ethyl groups at the same time when X=S; X is S, Se or Te; and n is an integer of 6 to 12.

The present invention further provides a process for producing said field-effect transistor by a dipping method, printing method, spin-coating method or the like.

The present invention further provides a liquid crystal display device comprising using said field-effect transistor as a switching element of the liquid crystal display part.

DESCRIPTION OF THE PREFERRED EMBODIMENTS

Figure 1:
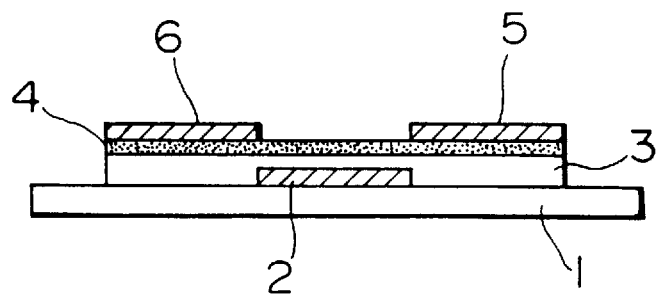
FIG. 1 is a cross-sectional view of the field-effect transistor.

With the aim of achieving the above-mentioned objects, the present inventors conducted many studies to find the following construction.

According to the field-effect transistor of the present invention, a conjugated oligomer having an ionization potential of 4.8 eV or above is used in the semiconductor layer thereof.

The hole mobility of this semiconductor layer is preferably 0.2 cm$^2$/Vs or above.

The conjugated oligomer used in the semiconductor layer preferably comprises 6 to 12 recurring units.

According to the field-effect transistor of the present invention, a compound represented by the following formula (I) can be used in the semiconductor layer:

$$R_1 \underbrace{\left( \underset{X}{\diagup\!\!\!\diagdown} \right)_n}_{} R_2 \quad (I)$$

wherein $R_1$ and $R_2$ each independently represents a hydrogen atom or substituent group, provided that $R_1$ and $R_2$ cannot be hydrogen atoms, or methyl groups or ethyl groups at the same time when X=S; X is S, Se or Te; and n is an integer of 6 to 12.

More concretely, when X=S, $R_1$ is a hydrogen atom, a halogen atom, a cyano group, a nitro group, an unsubstituted or substituted ester group preferably having 1 to 9 carbon atoms, an unsubstituted or substituted acyl group preferably having 1 to 9 carbon atoms, an unsubstituted or substituted alkyl group preferably having 1 to 8 carbon atoms, an unsubstituted or substituted alkoxy group preferably having 1 to 8 carbon atoms, an unsubstituted or substituted alkylthio group preferably having 1 to 8 carbon atoms, an unsubstituted or substituted allyl group preferably having 3 to 10 carbon atoms, or an unsubstituted or substituted alkenyl group preferably having 2 to 10 carbon atoms; and $R_2$ is a halogen atom, a cyano group, a nitro group, an unsubstituted or substituted ester group preferably having 1 to 9 carbon atoms, an unsubstituted or substituted acyl group preferably having 1 to 9 carbon atoms, an alkyl group substituted with one or more electron attractive groups and preferably having as a total 1 to 10 carbon atoms, an alkoxy group substituted with one or more electron attractive groups and preferably having as a total 1 to 10 carbon atoms, an alkylthio group substituted with one or more electron attractive groups and preferably having as a total 1 to 10 carbon atoms, an aryl group substituted with one or more electron attractive groups and preferably having as a total 6 to 15 carbon atoms, or an alkenyl group substituted with one or more electron attractive groups and preferably having as a total 2 to 12 carbon atoms; said electron attractive group preferably being a halogen group, a cyano group, a nitro group, etc.

When X=Se, $R_1$ and $R_2$ are independently a hydrogen atom, a halogen atom, a cyano group, a nitro group, an unsubstituted or substituted ester group preferably having 1 to 9 carbon atoms, an unsubstituted or substituted acyl group preferably having 1 to 9 carbon atoms, an unsubstituted or substituted alkyl group preferably having 1 to 8 carbon atoms, an unsubstituted or substituted alkoxy group preferably having 1 to 8 carbon atoms, an unsubstituted or substituted alkylthio group preferably having 1 to 8 carbon atoms, an unsubstituted or substituted allyl group preferably having 3 to 10 carbon atoms, or an unsubstituted or substituted alkenyl group preferably having 2 to 10 carbon atoms.

When X=Te, $R_1$ and $R_2$ are independently a hydrogen atom, a fluorine atom, a chlorine atom, an alkyl group preferably having 1 to 2 carbon atoms, or a methoxy group.

In the above, the substituents for ester, acyl, and the like groups are one or more alkyls, halogens, cyanos, nitros, aryls, etc.

The electric conductivity of the semiconductor layer is preferably controlled by gate electrodes separated from one another by insulating films. Owing to this structure, the voltage applied to gate electrodes can be made particularly high and the drain current can be modulated greatly. In other words, a high switching ratio can be realized. Further, the dispersion of element properties on the substrate can be made small.

Further, according to the field-effect transistor of the present invention, a compound represented by the following formula (II) can be used in the semiconductor layer:

wherein n is an integer of 6 to 12; $R_3$ is a hydrogen atom, a halogen atom, a cyano group, a nitro group, an unsubstituted or substituted ester group preferably having 1 to 9 carbon atoms, an unsubstituted or substituted acyl group preferably having 1 to 9 carbon atoms, an unsubstituted or substituted alkyl group preferably having 1 to 8 carbon atoms, an unsubstituted or substituted alkoxy group preferably having 1 to 8 carbon atoms, an unsubstituted or substituted alkylthio group preferably having 1 to 8 carbon atoms, an unsubstituted or substituted allyl group preferably having 3 to 10 carbon atoms, or an unsubstituted or substituted alkenyl group preferably having 2 to 10 carbon atoms; and $R_4$ is a halogen atom, a cyano group, a nitro group, an unsubstituted or substituted ester group preferably having 1 to 9 carbon atoms, an unsubstituted or substituted acyl group preferably having 1 to 9 carbon atoms, an alkyl group substituted with one or more electron attractive groups and preferably having as a total 1 to 10 carbon atoms, an alkoxy group substituted with one or more electron attractive groups and preferably having as a total 1 to 10 carbon atoms, an alkylthio group substituted with one or more electron attractive groups and preferably having as a total 1 to 10 carbon atoms, an aryl group substituted with one or more electron attractive groups and preferably having as a total 6 to 15 carbon atoms, or an alkenyl group substituted with one or more electron attractive groups and preferably having as a total 2 to 12 carbon atoms; said electron attractive group preferably being a halogen group, a cyano group, a nitro group, etc.

Further, according to the field-effect transistor of the present invention, a compound represented by the following formula (III) can be used in the semiconductor layer:

wherein n is an integer of 6 to 12; and $R_5$ and $R_6$ are independently a hydrogen atom, a halogen atom, a cyano group, a nitro group, an unsubstituted or substituted ester group preferably having 1 to 9 carbon atoms, an unsubstituted or substituted acyl group preferably having 1 to 9 carbon atoms, an unsubstituted or substituted alkyl group preferably having 1 to 8 carbon atoms, an unsubstituted or substituted alkoxy group preferably having 1 to 8 carbon atoms, an unsubstituted or substituted alkylthio group preferably having 1 to 8 carbon atoms, an unsubstituted or substituted allyl group preferably having 3 to 10 carbon atoms, or an unsubstituted or substituted alkenyl group preferably having 2 to 10 carbon atoms.

Owing to the use of the above-mentioned conjugated oligomer, a plurality of FET can be produced on a large-area substrate uniformly and simultaneously and the on-off ratio of drain current can be made great. Further, the FET can be made workable stably, long in the life-time of element and produceable by a simple procedure.

As embodiments of the process for producing the field-effect transistor of the present invention, there can be mentioned an embodiment of preparing a solution of a conjugated oligomer having an ionization potential of 4.8 eV or above and then forming a semiconductor layer by dipping method, an embodiment of preparing a solution of a conjugated oligomer in the same manner as above and then forming a semiconductor layer by printing method, and an embodiment of preparing a solution of a conjugated oligomer in the same manner as above and then forming a semiconductor layer by spin-coating method.

The substrate used in the formation of field-effect transistor of the present invention can be selected from a wide variety of materials, so far as the materials are insulating materials. Concretely speaking, inorganic materials such as glass, sintered alumina and the like and insulating plastic materials such as polyimide film, polyester film, polyethylene film, polyphenylene sulfide film, poly-p-xylene film and the like can be used. Particularly when a plastic substrate is used, a FET flexible and light in weight can be obtained. Further, plastic substrates can realize a FET element of large area, and therefore are useful for obtaining a liquid crystal display of large image area.

As the material of gate electrode constituting the field-effect transistor of the present invention, metals such as gold, platinum, chromium, palladium, aluminum, indium, molybdenum and the like, inorganic materials such as polysilicon, amorphous silicon, tin oxide, indium oxide, indium-tin oxide (ITO) and the like and organic materials such as polyaniline, polythiophene and the like can be used. Needless to say, the above-mentioned materials are not limitative, and combined use of two or more of these materials is also allowable. As the method for providing gate electrode, vapor deposition, sputtering, plating, CVD growing and dipping methods, printing, spin-coating, and the like can be adopted.

As the material constituting the semiconductor layer of the present invention, conjugated oligomers having an ionization potential of 4.8 eV or above are used as mentioned above. Preferably, those having an ionization potential of 4.8 to 6.0 eV are used. Hole mobility of the conjugated oligomer is preferably 0.2 $cm^2/Vs$ to 10 $cm^2/Vs$.

Specific examples of the conjugated oligomer of the present invention include the compounds of the following formulas:

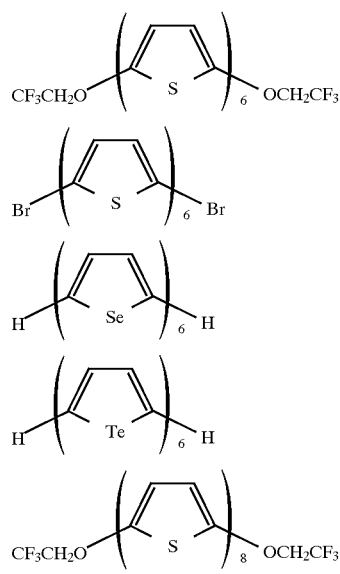

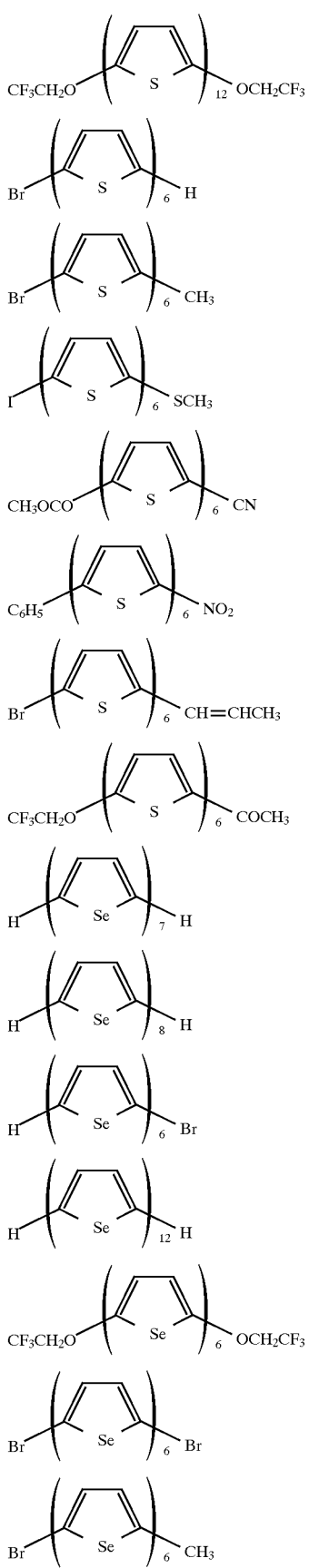

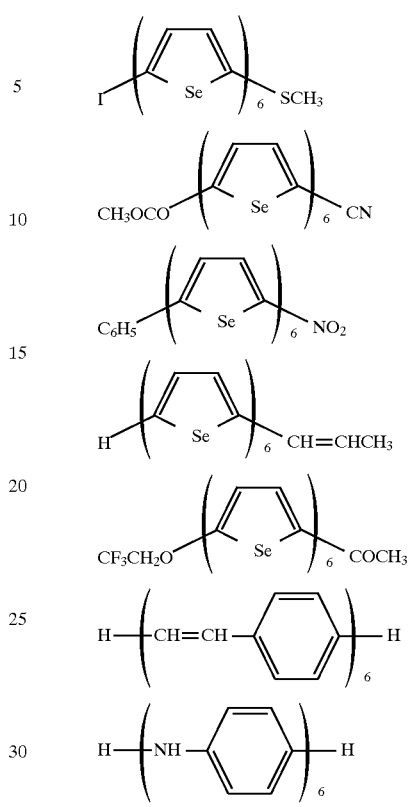

Needless to say, the present invention is by no means limited by these compounds. Combined use of two or more of these compounds is also allowable.

A semiconductor layer made of the above-mentioned organic compounds can easily be formed by vapor deposition method. When wet methods such as dipping method, printing method, spin-coating method and the like are used, a uniform semiconductor layer of large area can be obtained more easily.

The concentration of the solution used for forming an organic semiconductor layer according to wet method is 0.1 to 10% by weight, and preferably 0.1 to 5% by weight.

The materials which can be used as the insulating film of the present invention include inorganic materials such as $SiO_2$, $SiN_x$, $Al_2O_3$ and the like and organic materials such as polychloroprene, polyethylene terephthalate, polyoxymethylene, polyvinyl acetate, polyvinyl chloride, polyvinylidene fluoride, cyanoethyl-pullulan, polymethyl methacrylate, polysulfone, polycarbonate, polyimide and the like. Needless to say, the above-mentioned materials are not limitative.

Organic materials are particularly useful because, when such materials are used, an insulating film can be produced by printing method, spin-coating method or dipping method in the same manner as in the formation of organic semiconductor.

When a metal having a small work function such as aluminum or indium is used as gate electrode, a FET can be prepared by using a shot key junction between the above-mentioned metal and semiconductor layer without insulating film.

As the material of source electrode and drain electrode of the FET of the present invention, metals such as gold, silver, copper, aluminum, indium, chromium, molybdenum and the like; inorganic materials such as platinum silicide, indium silicide, low-resistance polysilicon, low-resistance amorphous silicon, tin oxide, indium oxide, indium, tin oxide (ITO) and the like, and organic materials such as polyaniline, polythiophene and the like can be used. Of these materials, gold, copper, chromium, molybdenum, tin oxide, indium oxide, indium, tin oxide (ITO), polyaniline and polythiophene are particularly preferred because these materials facilitate to make an ohmic contact with semiconductor layer.

As the method for obtaining a source electrode and a drain electrode, sputtering, plating, CVD method, vapor deposition method, ionized cluster beam vapor deposition method and the like can be adopted. In case of organic materials, wet methods such as dipping method, spin-coating method, printing method and the like can be adopted.

The reason why the FET of the present invention exhibits excellent characteristic properties can be considered as follows.

On the conjugated oligomers used in the semiconductor layer of prior art FET, a number of studies have been conducted, mainly concerning the method for enhancing mobility.

In order to enhance the mobility, it is necessary that the π-electron conjugation system has an sufficient length and the substrate has an appropriate crystallinity. Through these studies, conjugated oligomers having a high mobility such as sexithiophene derivatives [Advanced Materials, Vol. 2, p. 592 (1990)] and the like have been discovered.

All these materials, however, were disadvantageous in that, since they are high in electric conductivity, they cannot give a great on-off ratio of drain current when used in FET.

Electric conductivity σ of a material can be expressed by the following equation:

$$\sigma = e(n_e\mu_e + n_p\mu_p)$$

wherein e is elementary charge, ne is electron density in the material, $\mu_e$ is electron mobility in the material, np is positive hole density in the material, and $\mu_p$ is positive hole mobility in the material.

Most of the organic semiconductors are p-type semiconductors in which ne and $\mu_e$ are negligibly small. Accordingly, the following equation can be used in such a case:

$$\sigma = e \cdot n_p \times \mu_p$$

When the positive hole mobility $\mu_p$ becomes larger, the electric conductivity also becomes larger necessarily as predicted by the equations. Thus, a simultaneous realization of high mobility and low electric conductivity can be achieved only by lowering the positive hole density np in the p-type semiconductor.

Positive hole in a material is considered generated through a electron transfer reaction between an electron attractive substance and the material, and in the presence of air the oxygen is considered acting as said electron attractive substance. Accordingly, reduction of positive hole concentration requires to make the electron transfer reaction between p-type semiconductor and oxygen not occurring readily.

The electron transfer reaction between p-type semiconductor and oxygen is a reaction in which an electron is subtracted from p-type semiconductor and transferred into oxygen. Accordingly, readiness of occurrence of this reaction is dependent on the readiness of subtraction of electron from p-type semiconductor and readiness of accepting electron into oxygen.

As a characteristic indicating the readiness of subtraction of electron from semiconductor, ionized potential is used. A greater value of ionized potential means that subtraction of one electron from a material requires a greater energy. Thus, it is considered that, when ionized potential is 4.8 eV or above, the electron transfer reaction with oxygen does not occur readily, which brings about a decrease in positive hole concentration and a decrease in electric conductivity. Therefore, it is considered that, by using a conjugated oligomer having an ionized potential of 4.8 eV or above in the semiconductor layer, a FET having a high on-off ratio can be obtained.

By enhancing ionized potential, electric conductivity is lowered and on-off ratio is increased. Since a greater on-off ratio is more desirable, a higher ionized potential is more desirable. Although enhancement of ionized potential is accompanied by a disadvantage in that the contact with electrodes becomes insufficient, this fault can easily be overcome by (1) doping the contact part with electrodes or (2) using an electrically conductive polymer having the same structure as that of semiconductor layer as electrodes.

Particularly by using a conjugated oligomer having 6 or more recurring units and preferably 6 to 12 recurring units, a great on-current is obtained, and a FET having a high on-off ratio is obtained.

Alternatively, by using a conjugated oligomer having a hole mobility of 0.2 cm$^2$/Vs or above, a great on-current is obtained, and a FET element having a high on-off ratio can be obtained.

Since a higher on-off ratio is more desirable, a higher hole mobility is more desirable. By enhancing the hole mobility, the size of FET can be made smaller and the opening rate of LCD can be increased. Since a greater opening rate is more desirable, a greater hole mobility is more desirable. By enhancing hole mobility, the transistor becomes usable in TFT-LCD driver, etc.

As used in the present invention, the term "ionized potential" is defined as a value measured by means of photoelectron spectrometer in the presence of atmospheric air.

By using the field-effect transistor of the resent invention as a switching element of liquid crystal display part, a high-performance liquid crystal display device good in contrast ratio can be obtained.

Next, the present invention is explained in more detail with reference to the following Examples.

Synthesis Example 1

2-Bromo-5-trifluoroethoxythiophene was synthesized by the same procedure as mentioned in R. M. Kellog et al.: the Journal of Organic Chemistry, Vol. 33, No. 7, p. 2902 (1968).

Thus, 0.01 mole (2.61 g) of 2-bromo-5-trifluoro-ethoxythiophene was dissolved in 20 ml of diethyl ether. A Gringnard reagent was prepared by adding the solution thus obtained to a dispersion of 0.01 mole (0.243 g) of metallic magnesium in 20 ml of diethyl ether.

To the Grignard reagent thus obtained was added a catalytic quantity of 1,3-bis(diphenylphosphino)-propane nickel (II). Then, 0.004 mole (1.57 g) of 2,5''''-dibromo-quaterthiophene dispersed in diethyl ether was dropwise added thereto, and the resulting mixture was stirred overnight to obtain 2,5'''''-di(trifluoroethoxy)-sexithiophene.

Ionization potential of a vapor-deposited film of this compound was measured by means of photoelectron spectrometer in the presence of atmospheric air to obtain a result of 5.0 eV.

EXAMPLE 1

A chromium film was prepared on Corning 7059 glass substrate having a size of 33.7 mm×33.7 mm×1.1 mm by the vacuum vapor deposition method, and the product thus obtained was used as a gate electrode. Subsequently, a $SiO_2$ film having a thickness of 580 nm was formed by the sputtering method, and used as a gate insulating film. Then, a thin film of the compound of Synthesis Example 1 having a thickness of 50 nm was formed by the vacuum vapor deposition method.

Further, a source electrode and a drain electrode were prepared from gold by the vacuum vapor deposition method. The width of the source electrode and the drain electrode, namely the channel width, was 1 mm; and the distance between the two electrodes, namely channel length, was 100 $\mu$m. FIG. 1 illustrates construction of the FET thus obtained.

Figure 2:
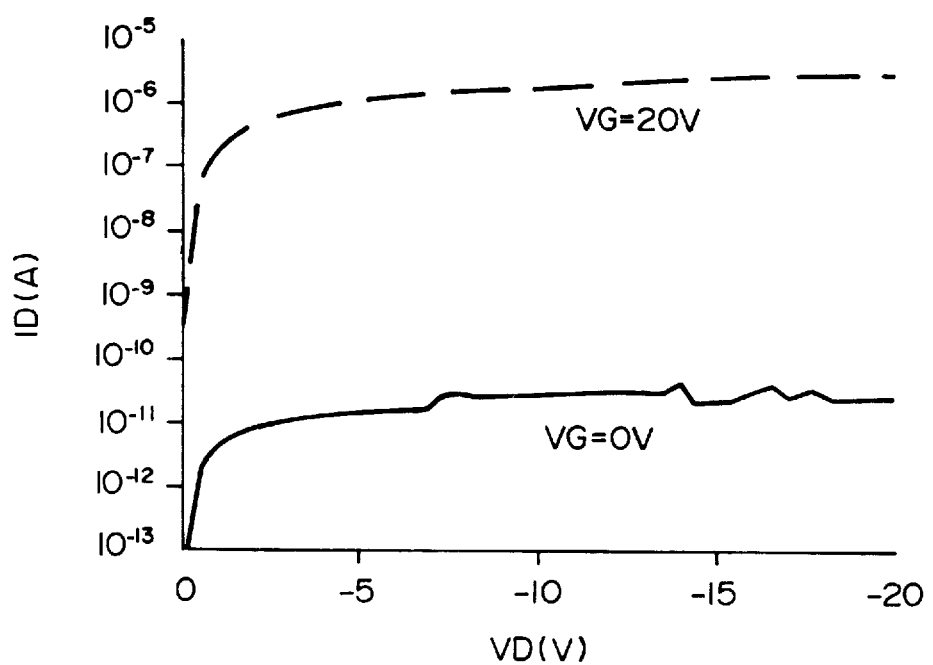
FIG. 2 is a graph illustrating the characteristic behavior of drain current against drain voltage.

FIG. 2 illustrates the characteristic curve of drain current ID against drain voltage VD, measured while changing gate voltage VG.

In FIG. 2, the abscissa is drain voltage VD and the ordinate is drain current ID. When drain voltage VG was 0 V, drain current ID was hardly detectable even when drain voltage VD was high. When a negative gate voltage VG was applied, however, a great drain current ID was observed.

It is apparent from FIG. 2 that drain current ID could be greatly modulated by changing the applied gate voltage VG.

According to the method mentioned in H. Akimichi et al.: Appl. Phys. Lett., Vol. 58, No. 14, p. 1500 (1991), the hole mobility at a drain voltage of −0.5 V was estimated from the characteristic curve of drain current against gate voltage of the FET mentioned above. As a result, the hole mobility was estimated as 0.23 $cm^2$/Vs.

Synthesis Example 2

2,5'''''-Dibromosexithiophene was synthesized by carrying out the reaction in the same manner as in Synthesis Example 1, except that the 2-bromo-5-trifluoroethoxythiophene was replaced with 2,5-dibromothiophene.

Ionization potential of a vapor-deposited film of this compound was measured by means of photoelectron spectrometer in the presence of atmospheric air to obtain a result of 5.6 eV.

EXAMPLE 2

A chromium film was formed on a glass substrate by the vacuum vapor deposition method, and used as a gate electrode. Next, a solution of cyanoethyl-pullulan in 1:1 mixture of acetonitrile-dimethyformamide was formed into a cyanoethyl-pullulan film having a thickness of 8 $\mu$m by casting method, and used as a gate insulating film. Then, the compound of Synthesis Example 2 was formed into a thin film having a thickness of 50 nm by the vacuum deposition method.

Figure 3:
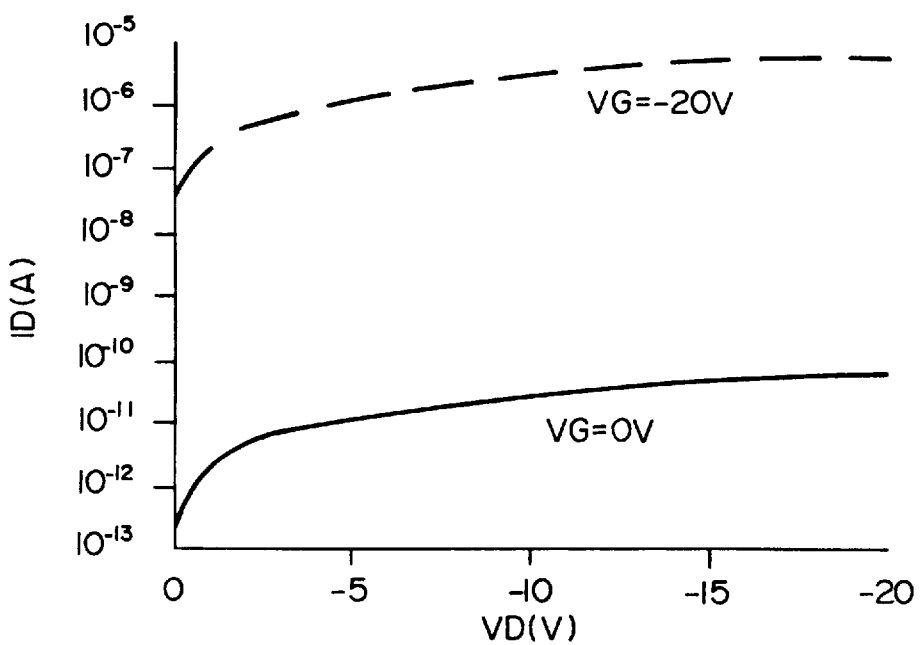
FIG. 3 is a graph illustrating the characteristic behavior of drain current against drain voltage.

Further, a source electrode and a drain electrode were prepared from gold by the vacuum vapor deposition method. The width of the source electrode and the drain electrode, namely the channel width, was 1 mm; and the distance between the two electrodes, namely channel length, was 100 $\mu$m. FIG. 3 illustrates the characteristic curve of drain current ID against drain voltage VD, measured while changing gate voltage VG.

In FIG. 3, the abscissa is drain voltage VD and the ordinate is drain current ID. When drain voltage VG was 0 V, drain current ID was hardly detectable even when drain voltage VD was high. When a negative gate voltage VG was applied, however, a great drain current ID was observed.

It is apparent from FIG. 3 that drain current ID could be greatly modulated by changing the applied gate voltage VG.

The hole mobility was estimated at a drain voltage of −0.5 V in the same manner as in Example 1 to obtain a result of 0.20 $cm^2$/Vs.

The compounds of the following Comparative Examples 1 to 4 and Example 3 can be synthesized in the same manner as in Synthesis Examples 1 and 2.

Comparative Example 1

A FET was prepared by repeating the procedure of Example 1, except that the following compound was used as a material of semiconductor layer:

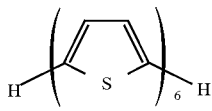

Figure 4:
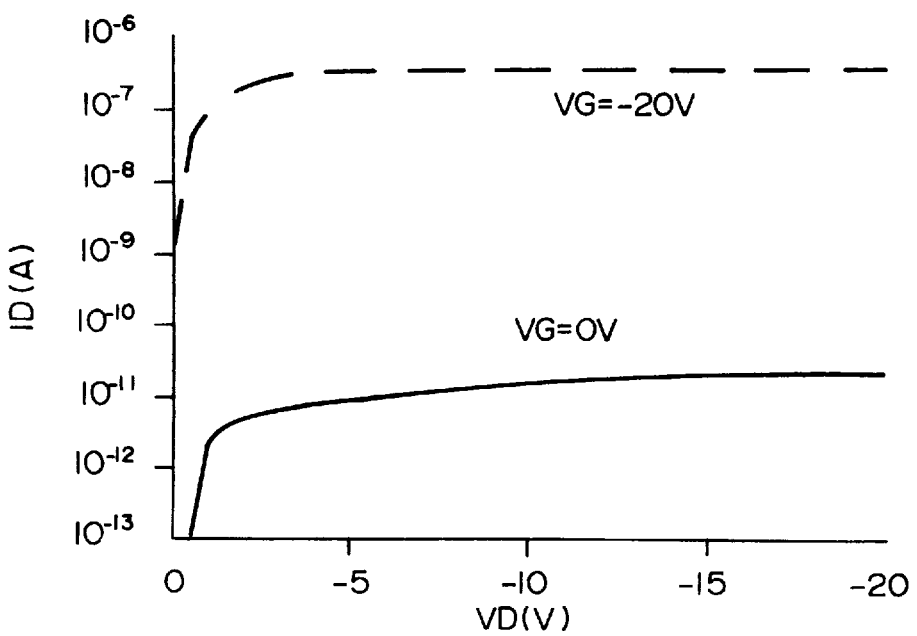
FIG. 4 is a graph illustrating the characteristic behavior of drain current against drain voltage.

While changing the gate voltage VG of the element thus obtained, the characteristic curve of drain current ID was measured against drain voltage VD to obtain the results shown in FIG. 4.

In FIG. 4, the abscissa is drain voltage VD and the ordinate is drain current ID.

In the FET obtained in Example 1, the drain current ID at the time of applying no gate voltage VG could be made small, and the drain current ID which could be modulated by changing gate voltage covered a range of 5 or more orders of magnitude; while in the FET obtained in Comparative Example 1, the drain current ID which could be modulated by changing gate current VG covered only about a range of 4 orders of magnitude.

When ionization potential of a vapor-deposited film of this compound was measured, the result was 4.5 eV.

Estimation of the hole mobility at a drain voltage of −0.5 V in the same manner as in Example 1 gave a result of 0.20 $cm^2$/Vs.

Comparative Example 2

A FET was prepared by repeating the procedure of Example 1, except that a compound of the following formula was used as the material of semiconductor layer:

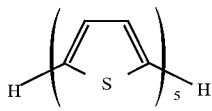

The on-off ratio (a value obtained by dividing drain current at the time of VD=−20 V and VG=−20 V by a drain current at the time of VD=−20 V and VG=0 V) of this element was 10,000, and no good on-off ratio was obtained. The ionization potential of the vapor-deposited film of this compound was 4.7 eV.

The hole mobility estimated in the same manner as in Example 1 at a drain voltage of −0.5 V was 0.05 $cm^2$/Vs.

Comparative Example 3

A FET was prepared by repeating the procedure of Example 1, except that a compound of the following formula was used as the material of semiconductor layer:

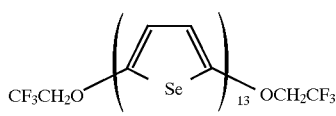

The on-off ratio (a value obtained by dividing drain current at the time of VD=−20 V and VG=−20 V by a drain current at the time of VD=−20 V and VG=0 V) of this element was 13,000, and no good on-off ratio was obtained.

The ionization potential of this compound was 4.8 eV. The hole mobility estimated in the same manner as in Example 1 at a drain voltage of −0.5 V was 0.1 cm²/Vs.

EXAMPLE 3

A FET was prepared by repeating the procedure of Example 2, except that a compound shown in Table 1 (compound A to compound Y) was used as the material of semiconductor layer. Ionization potentials and on-off ratios (values obtained by dividing the drain current at the time of VD=−20 V and VG=−20 V by the drain current at the time of VD=−20 V and VG=0 V) of the FET elements thus obtained were measured to obtain the results shown in Table 1.

TABLE 1

| Compound name | Ionization potential (eV) | Hole mobility (cm²/Vs) | ON-OFF ratio |
|---|---|---|---|
| A | 5.2 | 0.21 | 110000 |
| B | 5.4 | 0.30 | 120000 |
| C | 4.9 | 0.19 | 100000 |
| D | 4.8 | 0.15 | 70000 |
| E | 5.0 | 0.25 | 110000 |
| F | 4.7 | 0.15 | 60000 |
| G | 5.6 | 0.10 | 100000 |
| H | 5.6 | 0.23 | 105000 |
| I | 5.4 | 0.08 | 100000 |
| J | 5.4 | 0.15 | 105000 |
| K | 5.2 | 0.24 | 110000 |
| L | 5.1 | 0.20 | 104000 |
| M | 5.0 | 0.20 | 100000 |
| N | 5.0 | 0.21 | 100000 |
| O | 5.4 | 0.31 | 120000 |
| P | 5.4 | 0.27 | 115000 |
| Q | 5.6 | 0.25 | 106000 |
| R | 5.5 | 0.2 | 110000 |
| S | 5.6 | 0.17 | 102000 |
| T | 5.6 | 0.18 | 102000 |
| U | 5.6 | 0.15 | 101000 |
| V | 5.4 | 0.20 | 107000 |
| W | 5.5 | 0.20 | 109000 |
| X | 5.6 | 0.10 | 100000 |
| Y | 5.0 | 0.05 | 80000 |

As demonstrated in Table 1, all the FET elements showed a good on-off ratio.

Chemical formulas of the compounds of Table 1 are as follows:

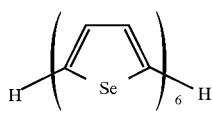 (A)

-continued

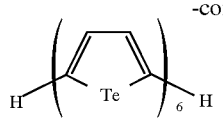 (B)

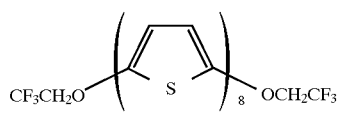 (C)

 (D)

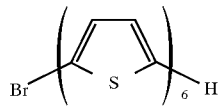 (E)

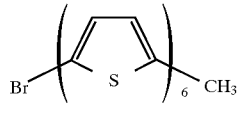 (F)

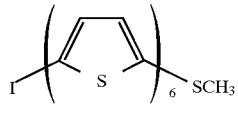 (G)

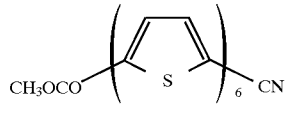 (H)

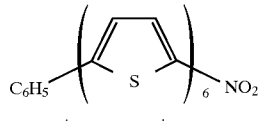 (I)

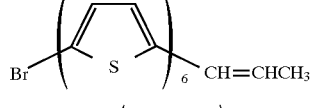 (J)

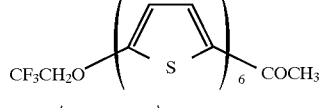 (K)

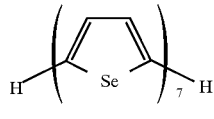 (L)

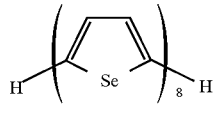 (M)

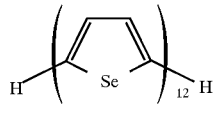 (N)

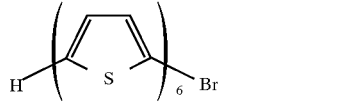 (O)

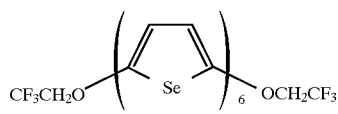 (P)

-continued

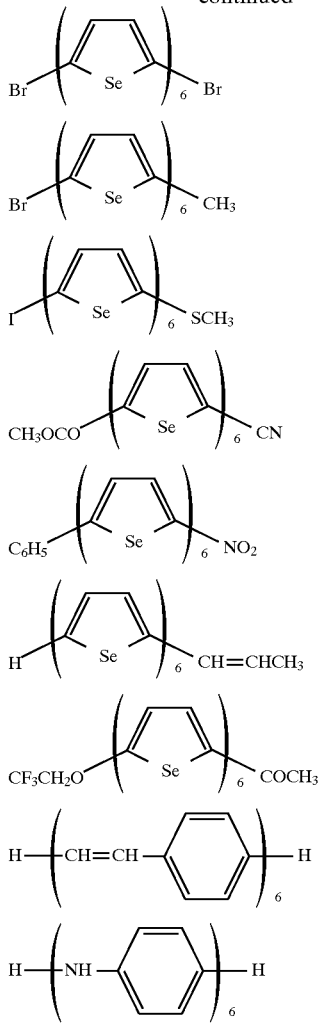

Comparative Example 4

A FET was prepared by repeating the procedure of Example 2, except that compound (IV) or compound (V) was used as the material of semiconductor layer. The on-off ratios of the products thus obtained were 15,000 and 14,000, respectively, provided that on-off ratio is a value obtained by dividing the drain current at the time of VD=−20 V and VG=−20 V by the drain current at the time of VD=−20 V and VG=0 V.

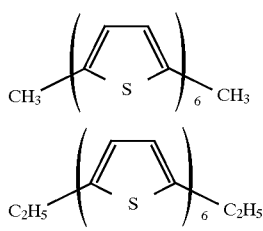

As measured by means of photoelectron spectrometer in the presence of atmospheric air, the ionization potentials of thin films of the compounds (IV) and (V) were 4.4 eV and 4.3 eV, respectively. The hole mobilities of (IV) and (V) at a drain voltage of −0.5 V, estimated in the same manner as in Example 1, were 0.05 cm$^2$/Vs and 0.1 cm$^2$/Vs, respectively.

Figure 9:
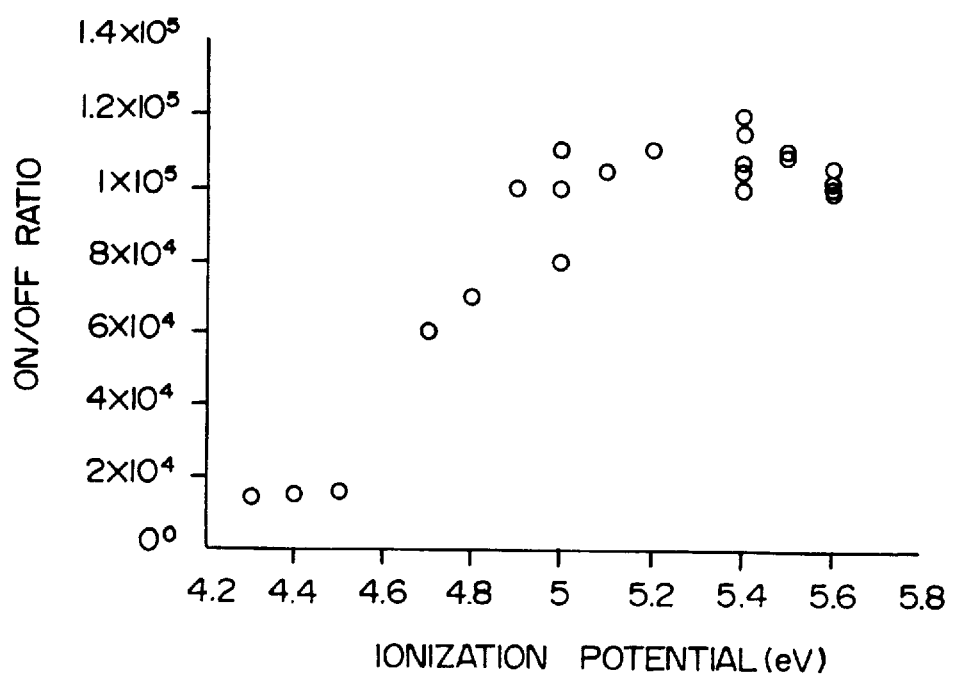
FIG. 9 is a graph illustrating the relation between on-off ratio and ionization potential.

The relations between on-off ratio and ionization potential in Examples 1 to 3 and Comparative Examples 1 to 4 are summarized in FIG. 9.

As shown in FIG. 9, on-off ratio greatly changes when ionization potential is about 4.8 eV.

EXAMPLE 4

A FET was prepared by repeating the procedure of Example 1, except that said substrate was a polycarbonate substrate.

The on-off ratio (a value obtained by dividing the drain current at the time of VD=−20 V and VG=−20 V by the drain current at the time of VD=−20 V and VG=0 V) was 150,000, which is a good on-off ratio.

EXAMPLE 5

In the same manner as in Example 1, a gate electrode and a gage insulating film were prepared on a substrate. The substrate was placed so that the contact width between transfer roll and substrate came to 1 cm, and printed with a 1% (by weight) solution of 2,5''''''-di(trifluoroethoxy)-sexithiophene in acetonitrile to prepare a semiconductor layer. Further, a source electrode and a drain electrode were prepared in the same manner as in Example 1 to obtain a FET.

The on-off ratio (a value obtained by dividing drain current at the time of VD=−20 V and VG=−20 V by a drain current at the time of VD=−20 V and VG=0 V) of this FET was 160,000, which was a good on-off ratio.

EXAMPLE 6

Figure 5:
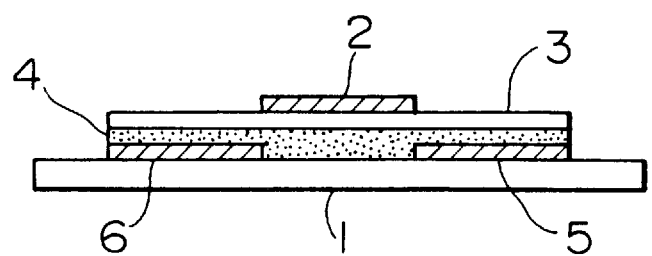
FIG. 5 is a cross-sectional view of one example of field-effect transistor.

A FET was prepared by repeating the procedure of Example 5, except that the construction of element was as shown in FIG. 5.

The on-off ratio (a value obtained by dividing drain current at the time of VD=−20 V and VG=−20 V by a drain current at the time of VD=−20 V and VG=0 V) of this FET was 150,000, which was a good on-off ratio.

EXAMPLE 7

Figure 6:
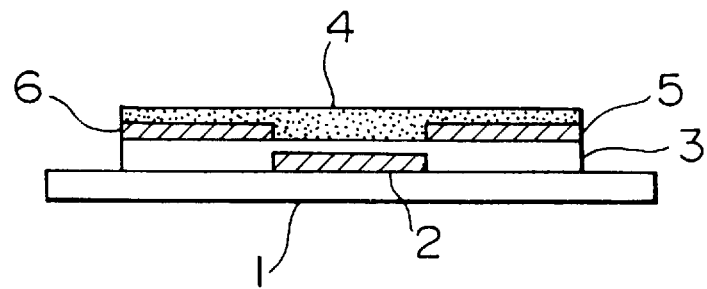
FIG. 6 is a cross-sectional view of another example of field-effect transistor.

A FET was prepared by repeating the procedure of Example 5, except that the construction of element was as shown in FIG. 6.

The on-off ratio (a value obtained by dividing drain current at the time of VD=−20 V and VG=−20 V by a drain current at the time of VD=−20 V and VG=0 V) of this FET was 150,000, which was a good on-off ratio.

EXAMPLE 8

Figure 7:
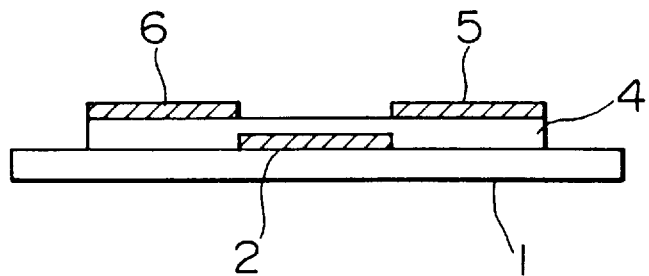
FIG. 7 is a cross-sectional view of yet another example of field-effect transistor.

A FET was prepared by repeating the procedure of Example 1, except that the construction of element was as shown in FIG. 7 and the gate electrode was Al.

The on-off ratio (a value obtained by dividing drain current at the time of VD=−20 V and VG=−20 V by a drain current at the time of VD=−20 V and VG=0 V) of this FET was 50,000, which was a good on-off ratio.

EXAMPLE 9

Five field-effect transistors, in the total, were simultaneously prepared in the same manner as in Example 5 on the center and four corners of a substrate, except that the substrate had a size of 50 cm×1 m×1.1 mm.

The on-off ratio (a value obtained by dividing drain current at the time of VD=−20 V and VG=−20 V by a drain current at the time of VD=−20 V and VG=0 V) of the central FET was 155,000, which was a good on-off ratio.

Further, the over-all on-off ratio (a value obtained by dividing the drain current at the time of VD=−20 V and VG=−20 V by the drain current at the time of VD=−20 V and VG=0 V) of the total FET elements was measured to obtain a result of 140,000 to 165,000. The dispersion of on-off ratio was small.

EXAMPLE 10

In the same manner as in Example 5, a semiconductor layer comprising a gate electrode, a gate insulating film and 2,5'''''-di(trifluoroethoxy)sexithiophene was prepared on a substrate. Then, the semiconductor layer was patterned by irradiating an excimer laser light (ArF, 195 nm) to the areas other than the channel parts through a mask so that the exposure amount came to 5 mJ/cm$^2$. Further, a source electrode and a drain electrode were prepared in the same manner as in Example 1 to obtain a FET.

The on-off ratio (a value obtained by dividing drain current at the time of VD=−20 V and VG=−20 V by a drain current at the time of VD=−20 V and VG=0 V) of the FET was 160,000, which was a good on-off ratio.

EXAMPLE 11

In the same manner as in Example 6, a semiconductor layer comprising a gate electrode, a gate insulating film and 2,5'''''-di(trifluoroethoxy)sexithiophene was formed on a substrate. Then, a light emitted from 100 W mercury lamp was irradiated through a mask to the areas other than the channel part for 10 minutes to convert the parts other than the channel part into an insulating material.

Further, a source electrode and a drain electrode was prepared in the same manner as in Example 1 to obtain a FET.

The on-off ratio (a value obtained by dividing drain current at the time of VD=−20 V and VG=−20 V by a drain current at the time of VD=−20 V and VG=0 V) of the FET was 160,000, which was a good on-off ratio.

EXAMPLE 12

Figure 8:
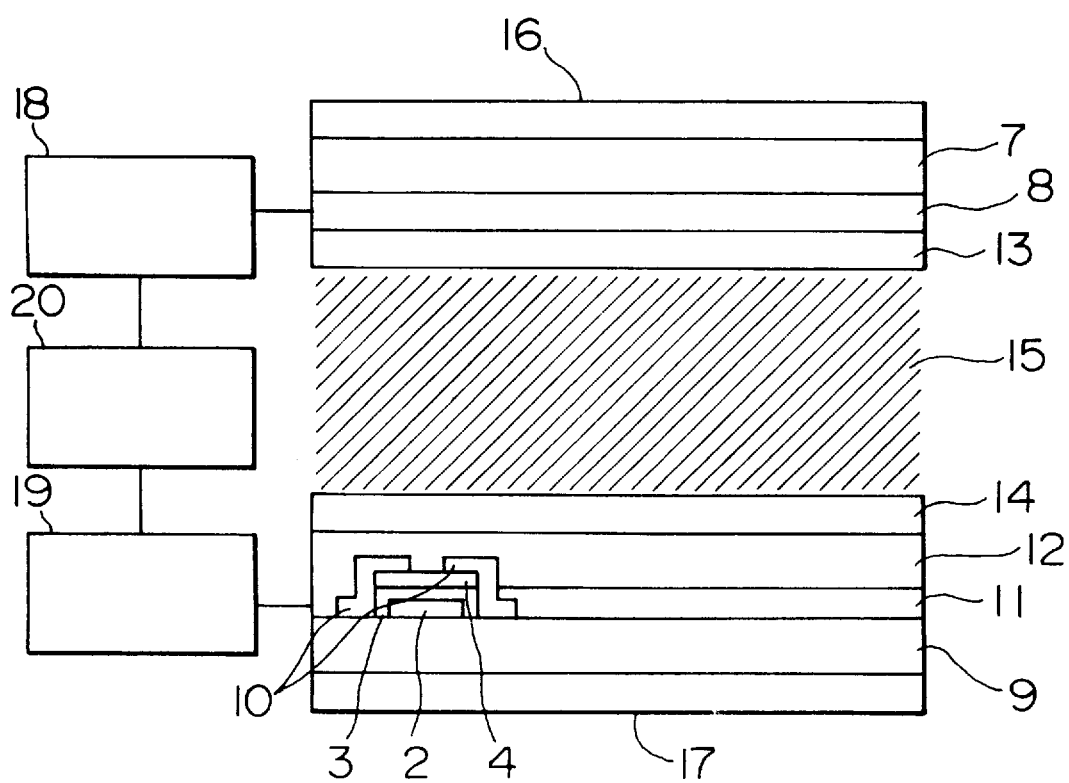
FIG. 8 is a view illustrating the construction of the liquid crystal display of the invention.

As shown in FIG. 8, a transparent common electrode 8 was formed on an optically transparent substrate 7. On substrate 9, gate electrode 2, gate insulating film 3, semiconductor layer 4 and source and drain electrodes 16 were formed from the same materials as in Example 1 in the same manner as in Example 1.

Next, image element electrode 11 and protecting film 12 were provided. Further, oriented films 13 and 14 having been rubbed in a prescribed direction were formed on the common electrode 8 and the protecting film 12, wherein the directions of rubbing of the oriented films 13 and 14 were rectangular to each other.

Then, a nematic liquid crystal 15 was put between the oriented films 13 and 14. Polarizing plates 16 and 17 were provided outside the substrates 7 and 9, respectively. The directions of the polarizing plates 16 and 17 were identical with the directions of rubbing of the oriented films 13 and 14, respectively.

Further, a common voltage feeding circuit 18 and a scanning voltage-signal feeding circuit 19 were provided, and sources 20 for feeding controlling signal, data signal and source voltage were connected to the circuits 18 and 19.

In the construction of FIG. 8, a composition constituted mainly of a cyanophenylcyclohexane compound (ZLI-4580, manufactured by Merck & Co., Ltd.) was used as the liquid crystal, polyimide RN-718 (manufactured by Nissan Chemical Industries, Ltd.) was used as the oriented films, and a polyvinyl alcohol type material G1220DU (manufactured by Nitto Electric Industrial Co., Ltd.) was used as the polarizing plates.

The liquid crystal display device obtained above was illuminated and evaluated. Contrast ratio of the image part was 150, and a good display was obtained.

EXAMPLE 13

Liquid crystal display devices were prepared in the same manner as in Example 12, except that the compounds A, E and W of Example 3 were used as the material of semiconductor layer. The liquid crystal display devices were illuminated and evaluated. As a result, the contrast ratios were 140, 150 and 100, respectively, each giving a good display.

In the field-effect transistor of the present invention, a conjugated oligomer having an ionization potential of 4.8 eV or above is used as the semiconductor layer. Due to this construction, there can be obtained a field-effect transistor which can be produced in a large number uniformly and simultaneously on a large-area substrate, and can greatly modulate the drain current upon changing the voltage applied to gate.

Further, there can be provided a FET which is stable in the work, long in the life-time of element and simple in the method of preparation.

Further, there can be provided a process for producing such a field-effect transistor by a simple procedure.

Further, there can be provided a liquid crystal display device using such a FET which is high in contrast ratio, inexpensive, stable and excellent in displaying characteristics. Further, there can be provided a large-area liquid crystal display device which is inexpensive, stable and excellent in displaying characteristics.

What is claimed is:

1. A process for producing a field-effect transistor comprising a step of preparing a solution of a conjugated oligomer having an ionization potential of 4.8 eV or above and a step of forming a semiconductor layer by a dipping method.

2. A process for producing a field-effect transistor comprising a step of preparing a solution of a conjugated oligomer having an ionization potential of 4.8 eV or above and a step of forming a semiconductor layer by a printing method.

3. A process for producing a field-effect transistor comprising a step of preparing a solution of a conjugated oligomer having an ionization potential of 4.8 eV or above and a step of forming a semiconductor layer by a spin-coating method.

4. A process for producing a field-effect transistor comprising:

(A) a step of forming a gate electrode on an insulating substrate, (B) a step of forming an insulating film on said gate electrode, (C) a step of forming a semiconductor layer constituted of a conjugated oligomer having an ionization potential of 4.8 eV or above by the use of a solution of said conjugated oligomer, and (D) a step of forming a source electrode and a drain electrode on said semiconductor layer.

5. A process for producing a field-effect transistor comprising:

(A) a step of forming a source electrode and a drain electrode on an insulating substrate, (B) a step of forming a semiconductor layer constituted of a conjugated oligomer having an ionization potential of 4.8 eV or above on said source electrode and drain electrode by the use of a solution of said conjugated oligomer, (C) a step of forming an insulating film on said semiconductor layer, and (D) a step of forming a gate electrode on said insulating film.

6. A process for producing a field-effect transistor comprising (A) a step of forming a gate electrode on an insulating substrate, (B) a step of forming an insulating film on said gate electrode, (C) a step of forming a source electrode and a drain electrode on said insulating film, and (D) a step of forming a semiconductor layer constituted of a conjugated oligomer having an ionization potential of 4.8 eV or above on said source electrode and drain electrode by the use of a solution of said conjugated oligomer.

7. A process for producing a field-effect transistor comprising a step of patterning a semiconductor layer constituted of a conjugated oligomer having an ionization potential of 4.8 eV or above by laser ablation method.

8. A process for producing a field-effect transistor comprising patterning a semiconductor layer constituted of a conjugated oligomer having an ionization potential of 4.8 eV or above through a partial conversion of the semiconductor layer to an insulating material by the method of ultraviolet irradiation.

* * * * *